(12) United States Patent
Tanaka

(10) Patent No.: US 7,751,060 B2
(45) Date of Patent: Jul. 6, 2010

(54) POSITION MEASURING METHOD, POSITION MEASURING SYSTEM, AND EXPOSURE APPARATUS

(75) Inventor: Takatoshi Tanaka, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 263 days.

(21) Appl. No.: 11/951,615

(22) Filed: Dec. 6, 2007

(65) Prior Publication Data

US 2008/0137097 A1      Jun. 12, 2008

(30) Foreign Application Priority Data

Dec. 7, 2006   (JP)   ............................. 2006-331141

(51) Int. Cl.
*G01B 11/02*   (2006.01)
(52) U.S. Cl. ..................................................... 356/500
(58) Field of Classification Search ................. 356/496, 356/498, 500
See application file for complete search history.

(56) References Cited

U.S. PATENT DOCUMENTS 4,765,741 A    8/1988   Detro et al.
4,814,625 A *  3/1989   Yabu ........................... 250/548
5,141,318 A *  8/1992   Miyazaki et al. ............ 356/500
5,469,260 A * 11/1995   Takagi et al. ................. 356/500
5,801,833 A *  9/1998   Kobayashi et al. .......... 356/500
5,870,198 A *  2/1999   Takagi ........................ 356/500

FOREIGN PATENT DOCUMENTS

JP           63-252203         10/1988

* cited by examiner

*Primary Examiner*—Michael A Lyons
(74) *Attorney, Agent, or Firm*—Rossi, Kimms & McDowell LLP

(57) ABSTRACT

A position measuring system includes a laser interferometer, and a wavelength detection unit detecting the wavelength change of a laser beam. A phase compensation unit compensates for the wavelength change detected by the wavelength detection unit based on the phase difference of aerial vibration between the wavelength detection unit and the optical path of the laser interferometer, which is determined based on the difference in length between a first path of the aerial vibration from the aerial vibration source of an air conditioner to the wavelength detection unit and a second path of the aerial vibration from the aerial vibration source to the optical path of the laser interferometer. A position measuring unit compensates for a measurement value obtained by the laser interferometer on the basis of the compensated wavelength change. In the position measuring system, the first path is designed to be shorter than the second path.

7 Claims, 9 Drawing Sheets

POSITION MEASURING METHOD, POSITION MEASURING SYSTEM, AND EXPOSURE APPARATUS

BACKGROUND OF THE INVENTION

1. Field of the Invention

The present invention relates to a position measuring system which has an interferometer to measure the position of a measurement target using interference of laser beams. The present invention also relates to an exposure apparatus having such a position measuring system.

2. Description of the Related Art

A laser interferometer having a helium-neon (He—Ne) laser as a light source is used for accurate length measurement or coordinate measurement. A measuring apparatus using a laser interferometer of this kind must include a wavelength compensation unit to compensate for a change in the measured optical path length caused by a change in the refractive index of an atmospheric gas through which a laser beam passes. A wavelength compensation unit generally includes a wavelength detection unit and a wavelength calculation unit. A wavelength detection unit generally employs a technique of detecting a wavelength using sensors to measure the atmospheric pressure, temperature, and humidity, or a technique of detecting a wavelength by using a wavelength sensor using an interferometer.

FIG. 4 is a view showing a position measuring system having a wavelength compensation unit described in Japanese Patent No. 02650953. Laser interferometers 23 and 24 for position measurement measure the position of a stage 1 as a measurement target using a laser beam from a laser light source 21. The laser beam from the laser light source 21 is partially directed to a wavelength sensor 10. The wavelength sensor 10 monitors the wavelength change of the laser beam.

In the position measuring system described in Japanese Patent No. 02650953, the wavelength sensor 10 is located far from the laser optical paths of the laser interferometers 23 and 24. This is because it is difficult from the viewpoint of space and cost to place the wavelength sensor 10 near the laser optical paths of the laser interferometers for position measurement.

However, when the wavelength sensor 10 is installed far from the laser optical paths of the laser interferometers 23 and 24, a difference is generated between the atmosphere in the wavelength sensor 10 and the atmosphere in the laser optical paths of the laser interferometers 23 and 24 for position measurement, resulting in a large compensation error. The present inventor found that especially, e.g., a fan acts as a sound source and generates a sonic wave (aerial vibration), and the difference between the phase of the sonic wave in the laser optical paths of the laser interferometers 23 and 24 and that at the wavelength detection position of the wavelength sensor 10 affects the compensation error.

SUMMARY OF THE INVENTION

According to an exemplary embodiment of the present invention, it is possible to reduce the error of laser beam wavelength compensation, which is generated by the difference between the phase of aerial vibration generated by an air conditioner in the laser optical path of a laser beam for position measurement and that at the wavelength detection position of a wavelength detection unit.

According to one aspect of the present invention, there is provided a position measuring system comprising:

a measurement unit which includes a laser interferometer configured to measure a position of a measurement target by using interference of a laser beam;

a wavelength detection unit configured to detect a wavelength change of the laser beam;

a first compensation unit configured to compensate for the wavelength change detected by the wavelength detection unit on the basis of a phase difference of aerial vibration between the wavelength detection unit and an optical path of the laser interferometer, which is determined on the basis of a difference in length between a first path of the aerial vibration from an aerial vibration source of an air conditioner to the wavelength detection unit and a second path of the aerial vibration from the aerial vibration source to the optical path of the laser interferometer; and a second compensation unit configured to compensate for a measurement value obtained by the laser interferometer on the basis of the wavelength change compensated by the first compensation unit, wherein the first path is shorter than the second path.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

Figure 1:
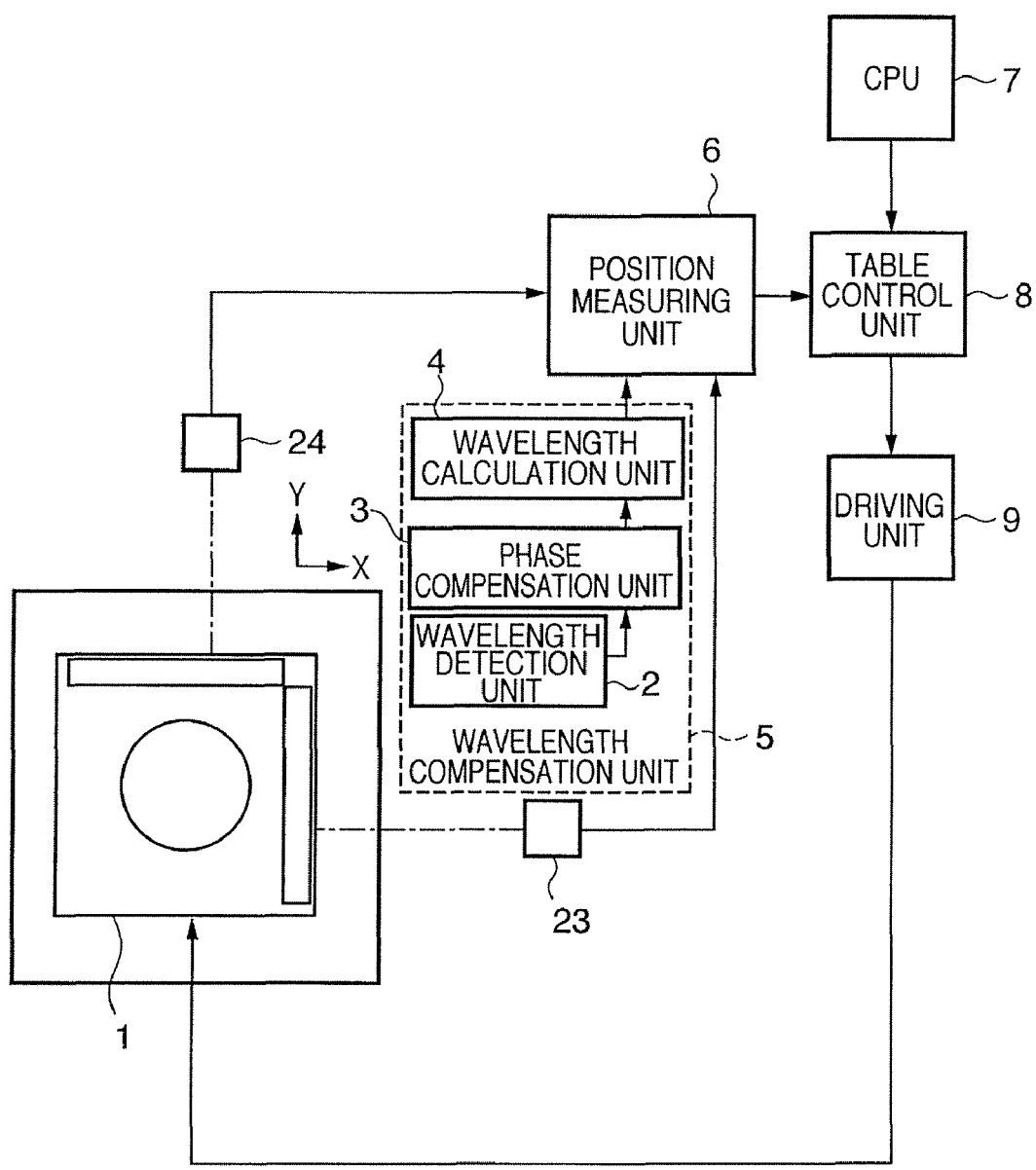
FIG. 1 is a block diagram showing an arrangement related to wavelength compensation of laser interferometers in an exposure apparatus according to an embodiment.

FIG. 1 is a block diagram showing the arrangement of a stage apparatus using a position measuring system according to an embodiment. The position measuring system of this embodiment has an arrangement (wavelength compensation unit 5) for wavelength compensation and a plurality of laser interferometers 23 and 24 to measure the position or orientation of a stage 1 as a measurement target. The wavelength compensation unit 5 includes a wavelength detection unit 2, phase compensation unit 3, and wavelength calculation unit 4. The wavelength detection unit 2 measures the wavelength change of a laser beam caused by changes in the atmospheric pressure, temperature, humidity, and the like. The wavelength detection unit 2 includes, e.g., a wavelength sensor 10 (FIG. 2) having laser interferometers. Alternatively, the wavelength detection unit 2 may include at least one (not shown) of a temperature sensor, humidity sensor, and atmospheric pressure sensor.

The phase compensation unit 3 reduces the error of a wavelength measurement value generated by the difference between the phase of a sonic wave in the wavelength detection unit 2 and that in the laser optical paths of the laser interferometers 23 and 24. The sonic wave here indicates aerial vibration (or atmospheric pressure variation) generated by a sound source such as the blower of an air conditioner. The phase compensation unit 3 compensates for the wavelength change detected by the wavelength detection unit 2 on the basis of the difference between the phase of aerial vibration generated in the wavelength detection unit 2 by the air conditioner and the phase of the aerial vibration in the optical path between the measurement target and each laser interferometer. In this specification, a sonic wave and aerial vibration, or a sound source and aerial vibration source are used in the same sense.

The wavelength calculation unit 4 calculates, as a compensation value, a wavelength (or wavelength change amount) obtained by causing the phase compensation unit 3 to compensate for the phase of a wavelength detected by the wavelength detection unit 2. A position measuring unit 6 measures the laser interferometers 23 and 24 using the thus obtained compensation value. That is, the phase compensation unit 3, wavelength calculation unit 4, and position measuring unit 6 provide an arrangement which obtains a measurement value by compensating for a measurement value obtained by the laser interferometers on the basis of the wavelength change compensated by the phase compensation unit 3 in measuring the position of a measurement target by using the laser interferometers.

In the arrangement of the position measuring system, the air conditioner and laser interferometer measuring apparatus are designed to make the length of the sonic wave path from the sound source to the wavelength detection unit 2 shorter than the path length up to the laser optical path of each laser interferometer for position measurement. The advantage of this arrangement is as follows. Generally, to eliminate the phase difference, the measurement value on the phase lead side is delayed by an amount corresponding to the phase difference. Hence, if the length of the sonic wave path from the sound source to the wavelength detection unit 2 is longer than the path length up to the laser optical path of each laser interferometer for position measurement, the phase of the output of the laser interferometer is delayed. However, when the in-phase state is obtained by delaying the phase of the output of each of the laser interferometers 23 and 24 for position measurement, the response speed of measurement by the laser interferometers decreases, resulting in a low positioning accuracy. Considering the stage control band using the laser interferometers, it is difficult to delay the phases of the laser interferometers. For this reason, in this embodiment, the air conditioner and laser interferometer measuring apparatus are designed such that the length of the sonic wave path from the sound source to the wavelength detection unit 2 becomes shorter than the path length up to the laser optical path of each laser interferometer for position measurement.

Let Lx and Ly be the lengths of the sonic wave paths up to the laser optical paths of the laser interferometers 23 and 24, Lc be the path length up to the wavelength detection unit 2, Va be the propagation velocity of sound in the space where interference measurement is done, and f be the frequency of the sonic wave. The path lengths Lx and Ly indicate the lengths from the aerial vibration source of the air conditioner (to be described later with reference to FIG. 2) to the laser optical paths. An example of the aerial vibration source is a fan. The phase difference of the sonic wave between the wavelength detection unit 2 and the laser optical paths of the laser interferometers 23 and 24 is calculated by $$\theta x = \frac{2\pi \cdot f(Lx - Lc)}{Va} \quad (1)$$

$$\theta y = \frac{2\pi \cdot f(Ly - Lc)}{Va}$$

Note that as the frequency f, for example, a value obtained by measuring the frequency at the position of the wavelength detection unit 2 as needed, or a value preset as the frequency of a sonic wave generated by the air conditioner of the position measuring system may be used.

The phase compensation unit 3 calculates outputs obtained by delaying the phase of the output from the wavelength detection unit 2 by θx and θy. On the basis of these outputs from the phase compensation unit 3, the wavelength calculation unit 4 calculates wavelength compensation values for the laser interferometers 23 and 24. The position measuring unit 6 measures the X- and Y-direction positions of the stage 1 by using the wavelength compensation values from the wavelength calculation unit 4 and signals from the laser interferometers 23 and 24.

A CPU 7 controls the overall stage apparatus. When the arrangement in FIG. 1 is applied to a semiconductor exposure apparatus, the CPU 7 can be a CPU that controls the semiconductor exposure apparatus. A table control unit 8 generates a driving instruction indicating the driving amount of the stage 1 on the basis of a moving instruction of the stage 1 from the CPU 7 and the measured position of the stage 1 input from the position measuring unit 6. A driving unit 9 drives the stage 1 in accordance with the driving instruction generated by the table control unit 8.

First Embodiment

Figure 2:
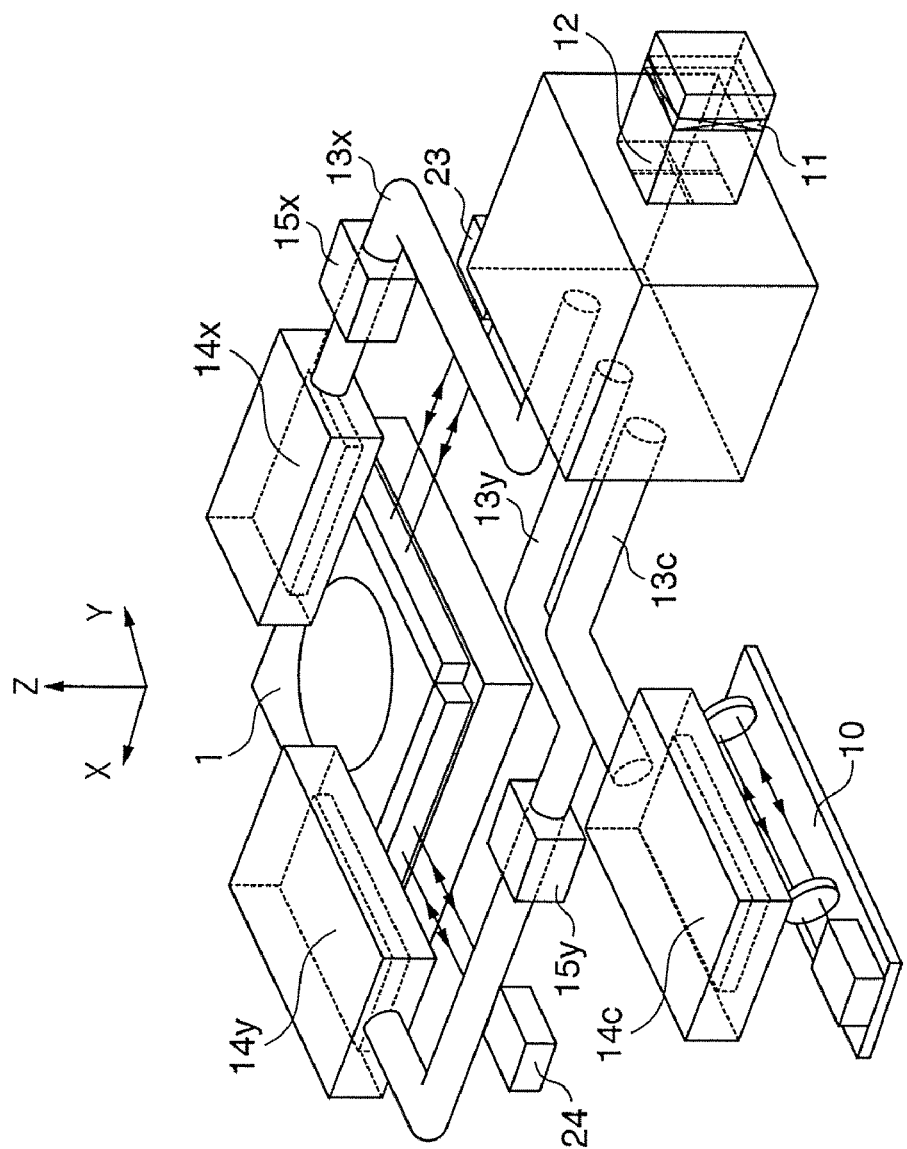
FIG. 2 is a perspective view showing an arrangement related to wavelength compensation of laser interferometers in a semiconductor exposure apparatus according to the first embodiment.
Figure 5:
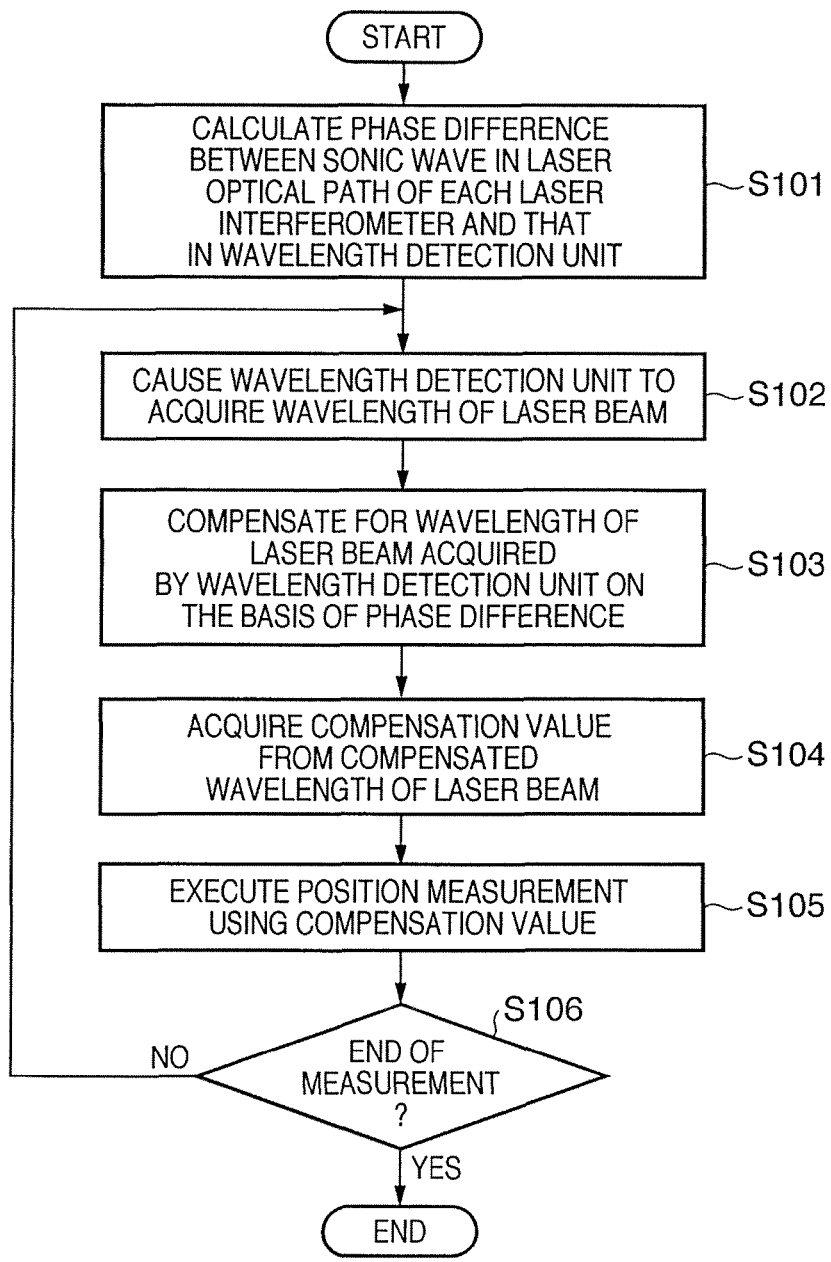
FIG. 5 is a flowchart for explaining position measurement control using the laser interferometers according to the first embodiment.

FIG. 2 is a perspective view showing the arrangement of a part related to wavelength compensation of laser interferometers in a semiconductor exposure apparatus according to the first embodiment. The semiconductor exposure apparatus of the first embodiment introduces the above-described position measuring system shown in FIG. 1 to measure the position of a stage on which a substrate or original plate is placed. As shown in FIG. 2, the semiconductor exposure apparatus has a stage 1 serving as a wafer stage and includes a laser interferometer 23 to measure the X-direction position of the stage 1, a laser interferometer 24 to measure the Y-direction position of the stage 1, and a wavelength sensor 10 serving as a wavelength detection unit 2. A blower (fan) 12 and thermoregulator 11 constitute an air conditioner. FIG. 5 is a flowchart for explaining position measurement control using the laser interferometers according to the first embodiment. The operation of the position measuring system according to the first embodiment will be described below with reference to the flowchart in FIG. 5.

A phase compensation unit 3 and wavelength calculation unit 4 execute the above-described compensation for a wavelength detected by the wavelength sensor 10, thereby obtaining compensation values. First, the phase compensation unit 3 calculates the phase differences (θx and θy) of a sonic wave from the sound source (blower 12 in this embodiment) on the basis of the path lengths (Lx, Ly, and Lc) from the sound source to the laser optical paths of the laser interferometers 23 and 24 and to the wavelength sensor 10 (S101). This calculation is done in accordance with equation (1) described above.

Next, the wavelength sensor 10 detects the wavelength of the laser beam (S102). Using the phase differences calculated in step S101, the phase compensation unit 3 executes delay compensation corresponding to each phase difference for the wavelength of the laser beam detected by the wavelength sensor 10 (S103). The wavelength calculation unit 4 calculates a compensation value to compensate for the measurement value of each laser interferometer on the basis of the wavelength compensated by the phase compensation unit 3 (S104). A position measuring unit 6 executes position measurement using the compensation values acquired in step S104 and signals from the laser interferometers 23 and 24 (S105). The process in steps S102 to S105 is repeatedly executed until measurement finishes (S106).

As described above, the position measuring unit 6 outputs the position (measurement value) of the stage 1 on the basis of the signals from the laser interferometers 23 and 24 and the compensation values obtained from the wavelength calculation unit 4. The phase compensation unit 3 and wavelength calculation unit 4 compensate for the output from the wavelength detection unit 2 on the basis of θx and θy and calculate the compensation values for the laser interferometers 23 and 24. Hence, compensation is done for each of the measurement value of the laser interferometer 23 for X-direction position measurement and the measurement value of the laser interferometer 24 for Y-direction position measurement.

On the other hand, laser interference measurement in the semiconductor exposure apparatus is executed in accurately air-conditioned space. At this time, the thermoregulator 11 heats or cools a gas, and the blower 12 (fan to blow the gas to the laser optical path) sends the gas to the vicinity of the wavelength sensor 10 and the laser optical paths of the laser interferometers 23 and 24 through fan ducts 13x, 13y, and 13c. A laminar flow of the gas blows from air conditioning outlets 14x, 14y, and 14c formed from, e.g., rectifying filters to the laser optical paths of the laser interferometers 23 and 24 and wavelength sensor 10.

In the above-described arrangement, an example of the sound source of the sonic wave reaching the laser optical paths is the blower 12. In this embodiment, the units are arranged such that the fan duct to guide the gas to the air conditioning outlet 14c is shorter than the fan ducts to guide the gas to the air conditioning outlets 14x and 14y. This makes the sonic wave path from the blower 12 to the vicinity of the wavelength sensor 10 shorter than those to the laser optical paths of the laser interferometers 23 and 24. As a result, the phase of the sonic wave in the wavelength sensor 10 advances from those in the laser optical paths of the laser interferometers 23 and 24. When the phase compensation unit 3 delays the phase of the output of the wavelength sensor, wavelengths in the laser optical paths of the laser interferometers 23 and 24 can be obtained. It is therefore possible to reduce the phase difference of the sonic wave between the wavelength sensor 10 and each of the laser optical paths of the laser interferometers 23 and 24.

A digital filter such as a dead time filter, moving average filter, or lowpass filter is also usable as the phase compensation unit 3. The digital filter can design different phase characteristics. Designing a filter with a phase characteristic considering the sonic wave phase differences θx and θy between the wavelength sensor 10 and the laser optical paths of the laser interferometers 23 and 24 allows to more accurately compensate for the measurement error generated by the phase difference of the sonic wave. If compensation is executed to delay the phases of the outputs of the laser interferometers 23 and 24, the control performance of the stage 1 deteriorates, and the positioning accuracy becomes low. Generally, it is impossible to design a filter to advance the phase of an input waveform. Hence, in this embodiment, the phase difference is adjusted by a filter to delay the phase of the output of the wavelength sensor 10. From this viewpoint, the system of this embodiment is designed to make the phase of the sonic wave in the wavelength sensor 10 advance from those in the laser optical paths of the laser interferometers 23 and 24.

However, even the above-described arrangement cannot actually generate a time delay based on equation (1) in all frequencies of sonic waves. Especially, compensation is often difficult in a high frequency band. As a measure against this, in the first embodiment, silencers 15x and 15y are provided on the fan ducts 13x and 13y to guide the gas to the laser optical paths of the laser interferometers 23 and 24 to reduce the sonic wave in the fan ducts. The silencers reduce a sonic wave in a frequency band that cannot completely be compensated by the phase compensation unit 3, thereby reducing the compensation error. The silencers 15x and 15y can use any one of a sound absorption type silencer, reactive silencer, and active noise control or a combination of some of them.

When the frequency band as the sound attenuation target is determined, and the silencers 15x and 15y are designed in consideration of the actual sonic wave and the characteristic of the phase compensation unit 3 in the above-described manner, compact low-power silencers can be implemented.

In the first embodiment, the silencers 15x and 15y are installed on the fan ducts 13x and 13y. However, the present invention is not limited to this. For example, the silencers may reduce a sonic wave on the paths to the laser optical paths of the laser interferometers 23 and 24 or a sonic wave in the laser optical paths of the laser interferometers 23 and 24. Additionally, a silencer having the same characteristic as the silencer 15x or 15y may be provided on the fan duct 13c, on the sonic wave path to the wavelength sensor 10, or near the wavelength sensor 10. For example, a microphone to detect the sonic wave of a laser beam is installed near the laser optical path, and a speaker is installed in the same space as the microphone to attenuate the detected sonic wave. This arrangement can suppress the compensation error generated by the variation in the path length caused by reflection of the sonic wave. One of the reasons why it is preferable to provide a silencer on the fan duct 13c, like the silencers 15x and 15y, is that a wavelength sensor with a silencer may be more advantageous in implementation, considering, e.g., reflection of sound.

In the first embodiment, the above-described arrangement is applied to the laser optical paths of the laser interferometers 23 and 24 that measure the X- and Y-direction positions of the stage 1. However, the present invention is not limited to this. For example, the arrangement may be applied to a laser interferometer to measure the Z-direction position of the stage 1.

In the first embodiment, the aerial vibration source of the air conditioner is the blower 12. However, the present invention is also applicable to any sound source other than the blower. Other examples of the sound source are the stage (acceleration/deceleration of the stage produces a sonic wave) and chamber walls (a sonic wave from a sound source of some kind outside the chamber propagates through the wall surfaces).

In the first embodiment, the wavelength sensor 10 is used as the wavelength detection unit 2. However, the wavelength detection unit 2 may also include at least one of an atmospheric pressure sensor, temperature sensor, and humidity sensor. In this case, the path length from the source should be taken into consideration in accordance with the physical quantity that changes. For example, when the arrangement of the present invention is implemented by using a temperature sensor, the wavelength compensation unit 5 should be designed in consideration of the length of the fan duct from the thermoregulator to each optical path (optical axis). When a humidity sensor is used, the wavelength compensation unit 5 should be designed in consideration of the length of the path (fan duct) from a humidity controller to each optical path (optical axis). That is, the wavelength compensation unit 5 converts the temperature or humidity detected at the position of the wavelength detection unit 2 into a temperature or humidity in the optical path of each interferometer on the basis of the length of the path and further compensates for the wavelength compensated by the phase compensation unit 3 in accordance with the converted temperature or humidity. This arrangement can suppress the variation in the wavelength of the laser beam caused by the temperature or humidity in addition to the variation in the wavelength of the laser beam caused by the phase difference of the sonic wave from the air conditioner.

Second Embodiment

In the first embodiment, the gas sent from the air conditioner is supplied to the vicinity of the wavelength sensor 10 and the laser optical paths of the laser interferometers 23 and 24 through the fan ducts. In the second embodiment, a wavelength sensor 10 and the laser optical paths of laser interferometers 23 and 24 are air-conditioned by using a single air conditioning outlet. The arrangement of a position measuring system is the same as in the first embodiment (FIG. 1).

Figure 3:
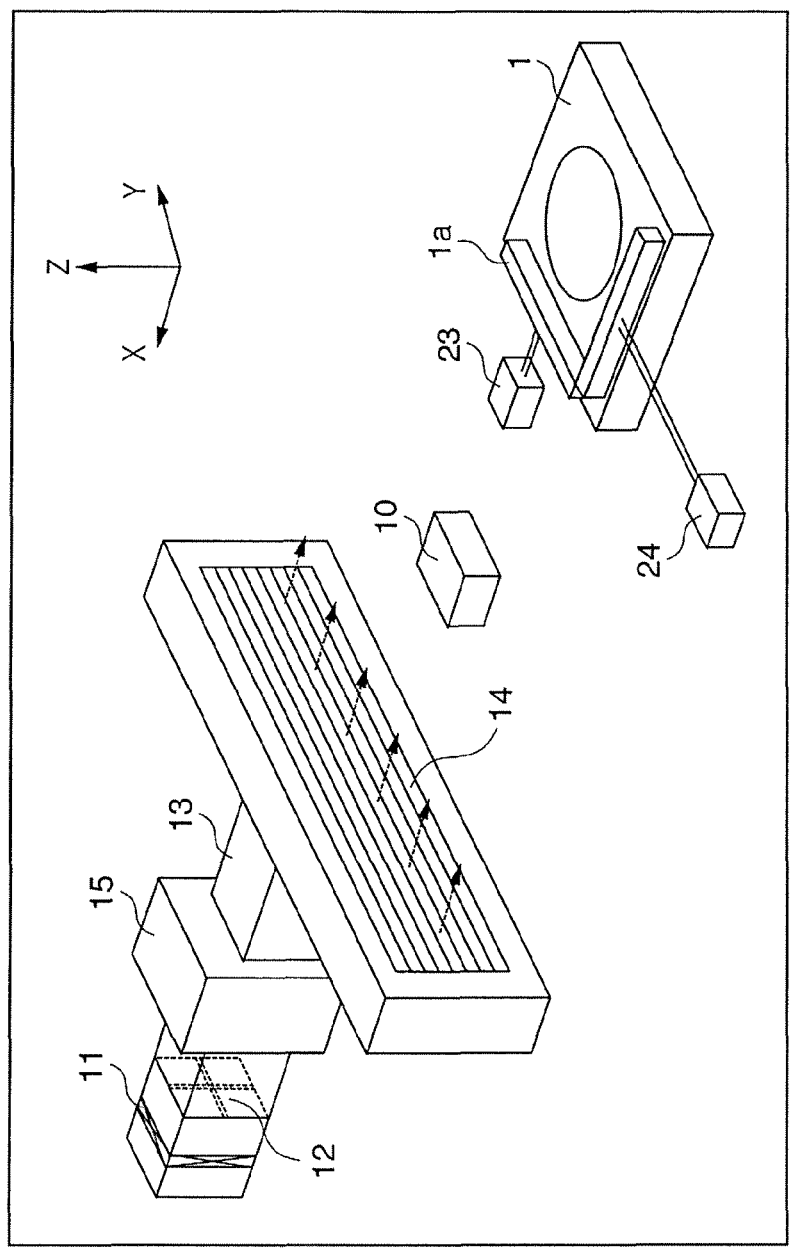
FIG. 3 is a perspective view showing an arrangement related to wavelength compensation of laser interferometers in a semiconductor exposure apparatus according to the second embodiment.
Figure 4:
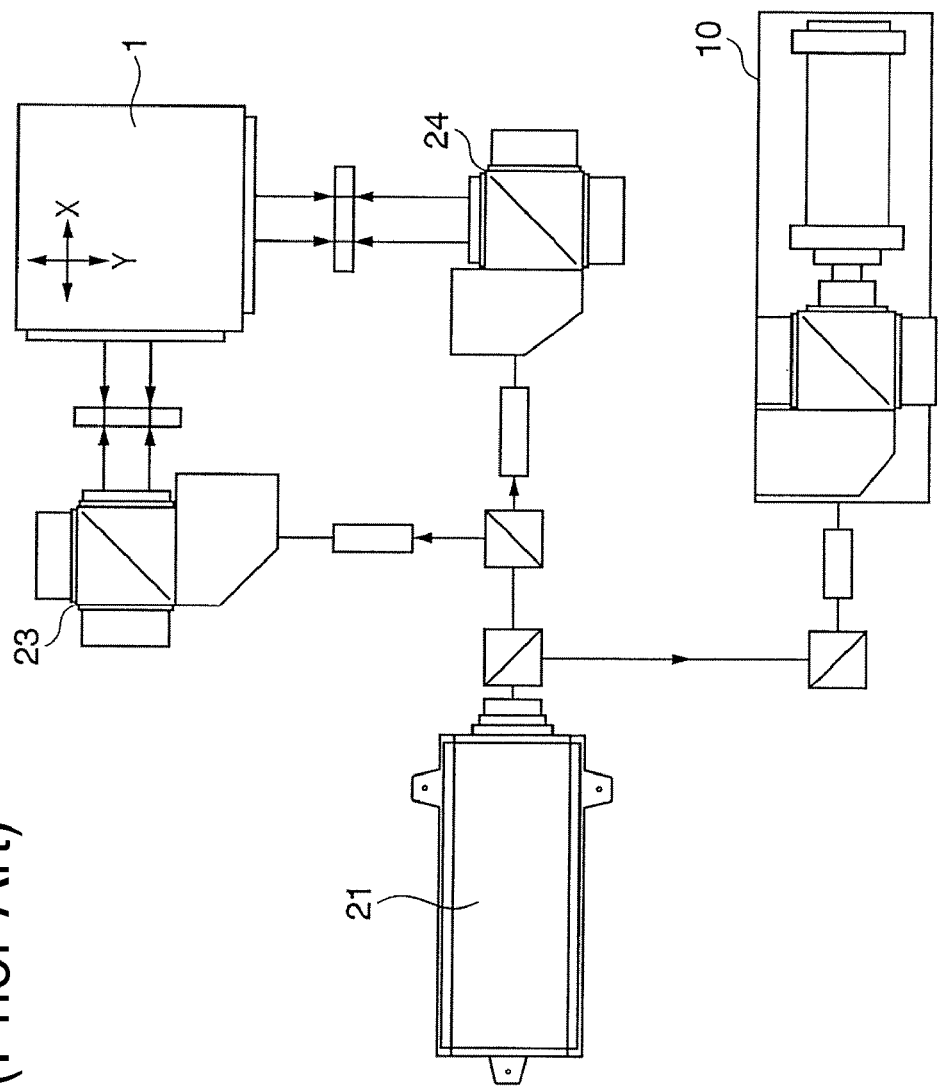
FIG. 4 is a view showing the arrangement of a wavelength compensation unit for laser interferometers in a common exposure apparatus.

FIG. 3 is a perspective view showing the schematic arrangement of a system which causes the laser interferometers 23 and 24 to measure the position of a stage 1 in a semiconductor exposure apparatus according to the second embodiment. In the second embodiment, it is impossible to design fan ducts such that the sonic wave path from a blower 12 serving as a sound source to the wavelength sensor 10 becomes shorter than the paths to the laser optical paths of the laser interferometers 23 and 24. In the second embodiment, instead, the wavelength sensor 10 is installed closer to an air conditioning outlet 14 than the laser interferometers 23 and 24. As in the first embodiment, a phase compensation unit 3 delays the phase of the output of the wavelength sensor 10, thereby reducing a compensation error generated by the phase difference of the sonic wave. A silencer 15 is designed to reduce a sonic wave in a frequency band that cannot completely be compensated by the phase compensation unit 3.

In addition, the laser beam irradiation direction of the laser interferometer 23 is not perpendicular to the direction from the air conditioning outlet to the laser interferometer 23. For this reason, the sonic wave path length to the laser optical path is not constant and changes momentarily in accordance with the position of the stage. In this embodiment, the path length from the sound source (blower 12) to the intermediate point (e.g., central point) between the laser interferometers 23 and 24 and a reflecting mirror 1a at each time is used. The phase compensation unit 3 delays the output of the wavelength sensor 10 by an amount corresponding to the phase delay of the sonic wave, which is caused by the difference between the path length from the sound source to the intermediate point and that from the sound source to the wavelength sensor 10. The position of the intermediate point changes as the stage moves. Hence, the characteristic of the phase compensation unit 3 is also changed in accordance with the position of the moving stage.

Figure 6:
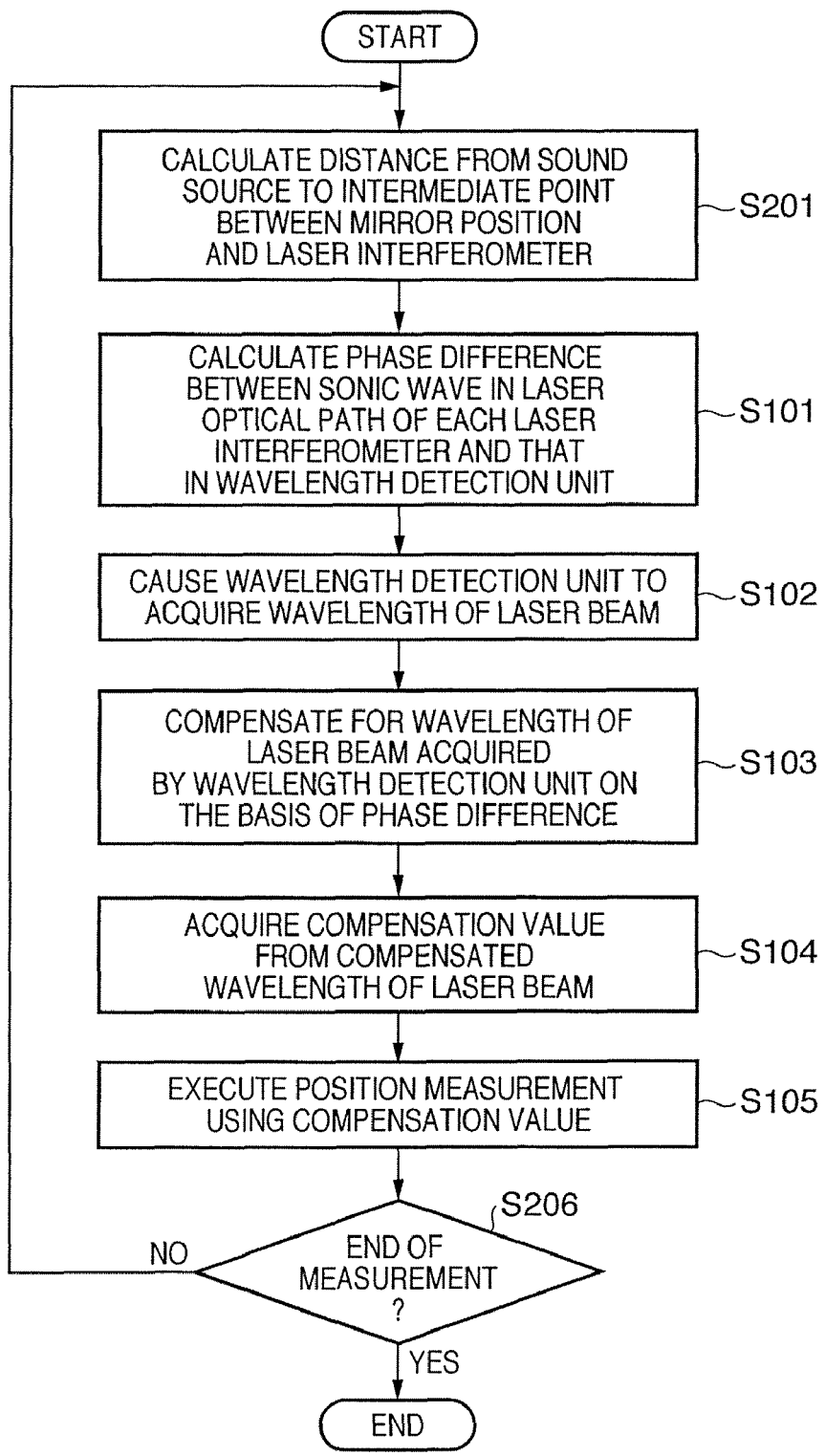
FIG. 6 is a flowchart for explaining position measurement control using the laser interferometers according to the second embodiment.

FIG. 6 is a flowchart for explaining position measurement control using the laser interferometers according to the second embodiment. In the second embodiment, the phase compensation unit 3 calculates the distance between the sound source and the position of the intermediate point, which changes on the basis of the position of the stage 1 (S201). As the position of the stage 1 (reflecting mirror 1a), an immediately preceding measurement value of a position measuring unit 6 is usable. In the second embodiment, the distance (i.e., phase θx) from the sound source to the intermediate point of the laser optical path of the laser interferometer 23 changes in accordance with the position of the stage 1. The distance (i.e., phase θy) from the sound source to the laser interferometer 24 does not change. The process in steps S101 to S105 is the same as in the first embodiment (FIG. 5). The process in steps S201 to S105 is repeated while the measurement continues (S206).

In the second embodiment, the silencer 15 is installed on a fan duct 13. However, the silencer may reduce the sonic wave in the laser optical path of each laser interferometer. An example is the above-described arrangement including a microphone and a speaker. In this case, when the frequency band of the laser beam of the laser interferometer 23 as the attenuation target of the silencer is changed in accordance with the position of the stage 1, a low-power silencer can be implemented.

In the second embodiment, the laser interferometers for the X and Y directions of the stage 1 have been described. However, the present invention is not limited to this and is also applicable to the laser optical path of a laser interferometer for the Z direction of the stage 1.

In the second embodiment, the sonic wave source is the blower 12. However, the present invention may be applied to any sonic wave source other than the blower.

In the above-described embodiments, the wavelength sensor 10 is used as the wavelength detection unit 2. However, the wavelength detection unit may detect a wavelength by using sensors to measure the atmospheric pressure, temperature, and humidity. In this case, the path length from the source should be taken into consideration in accordance with the physical quantity that changes. For example, when the arrangement of the present invention is implemented by using a temperature sensor, the phase compensation unit should be designed in consideration of the length of the path from the thermoregulator to each optical path (e.g., the length of the fan duct or the length from the air conditioning outlet 14 to each optical path). When a humidity sensor is used, the phase compensation unit should be designed in consideration of the length of the path from a humidity controller to each optical axis (e.g., the length of the fan duct or the length from the air conditioning outlet 14 to each optical path).

As described above, according to the above-described embodiments, there is provided a position measuring system comprising the laser interferometers 23 and 24 which measure the position of the measurement target (stage 1) by using interference of a laser beam, and the wavelength compensation unit 5 which compensates for the wavelength change of the laser beam. The phase compensation unit 3 compensates for the wavelength change detected by the wavelength detection unit 2 on the basis of the phase difference of aerial vibration generated by the air conditioner, which is determined on the basis of the difference in the length between a first path of the aerial vibration up to the wavelength detection unit 2 and a second path up to the optical axis position of each of the laser interferometers 23 and 24. The air conditioner includes, e.g., the thermoregulator 11 and blower 12. The wavelength calculation unit 4 and position measuring unit 6 compensate for measurement values obtained by the laser interferometers 23 and 24 on the basis of the wavelength change compensated by the phase compensation unit 3. This arrangement reduces the measurement error of the wavelength of the laser beam, which is generated by the phase difference of the aerial vibration (sonic wave or atmospheric pressure variation) generated by the air conditioner between the wavelength detection unit 2 and the optical axis positions of the laser interferometers 23 and 24, and implements more accurate position measurement. Especially in the above-described embodiments, the first path is designed to be shorter than the second path, as described with reference to FIGS. 2 and 3. Hence, the phase compensation unit 3 delays the wavelength or wavelength change detected by the wavelength detection unit 2 by an amount corresponding to the phase difference.

In the second embodiment, the path lengths of the aerial vibration generated by the air conditioner to the optical axis positions of the laser interferometers 23 and 24 are calculated on the basis of the position of the measurement target (stage 1) measured by the position measuring unit 6, and the phase difference is determined by using the path lengths. That is, since the phase difference is calculated in accordance with the position of the measurement target, it is possible to more accurately determine the phase difference even when the measurement target moves. Hence, the phase compensation unit 3 can execute more accurate compensation.

Third Embodiment

The above-described position measuring system according to the first or second embodiment is applicable to an exposure apparatus used in a semiconductor device manufacturing process.

Figure 7:
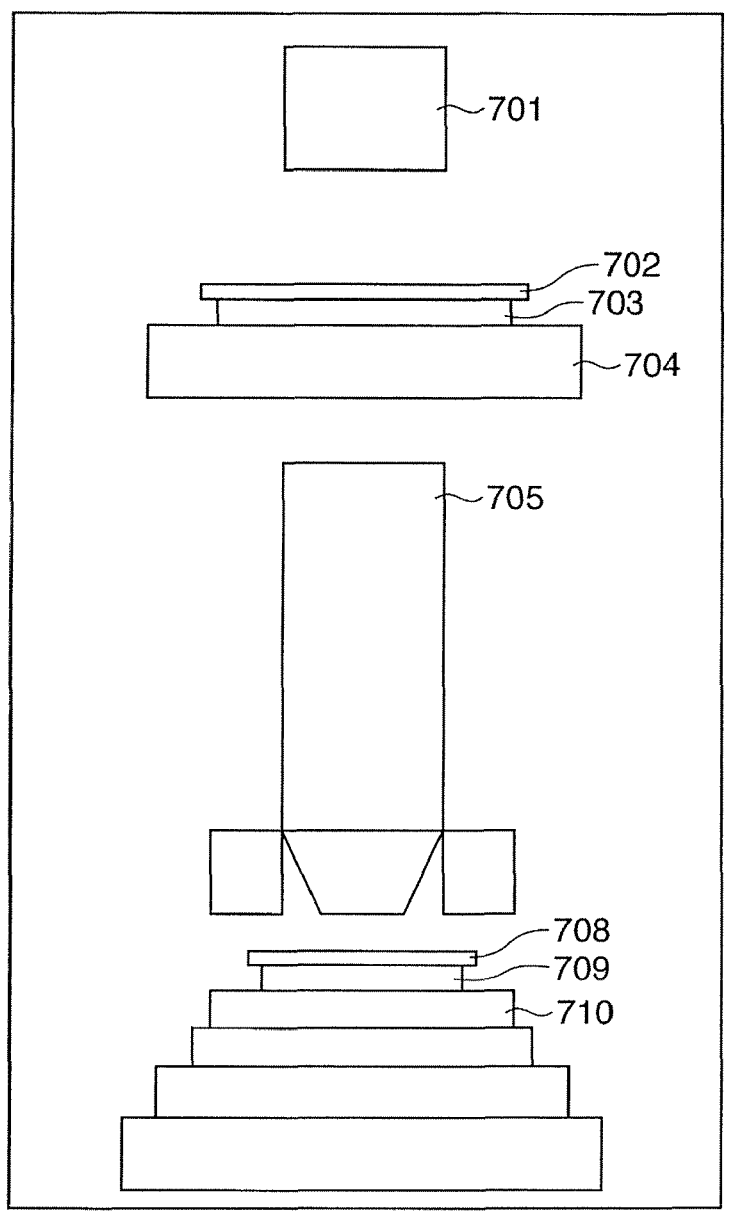
FIG. 7 is a view showing the schematic arrangement of an exposure apparatus according to an embodiment.

FIG. 7 is a view showing the schematic arrangement of an exposure apparatus. In the exposure apparatus, a reticle 702 as an exposure original plate is placed on a reticle stage 704 through a reticle chuck 703. Exposure light guided from a light source (not shown) through an illumination optical system 701 irradiates the reticle 702. A projection optical system 705 reduces the exposure light that has passed through the reticle 702 to, e.g., ⅕. The reduced light irradiates a silicon wafer 708 as a process target. A wafer chuck 709, i.e., a so-called substrate holder serving as a means for holding the silicon wafer 708 is mounted on a wafer stage 710 capable of moving the substrate in the X and Y directions in the horizontal plane. This exposure apparatus can accurately control the reticle stage 704 and/or wafer stage 710 by applying the above-described position measuring system to measure the positions of the stages as a measurement target.

Figure 8:
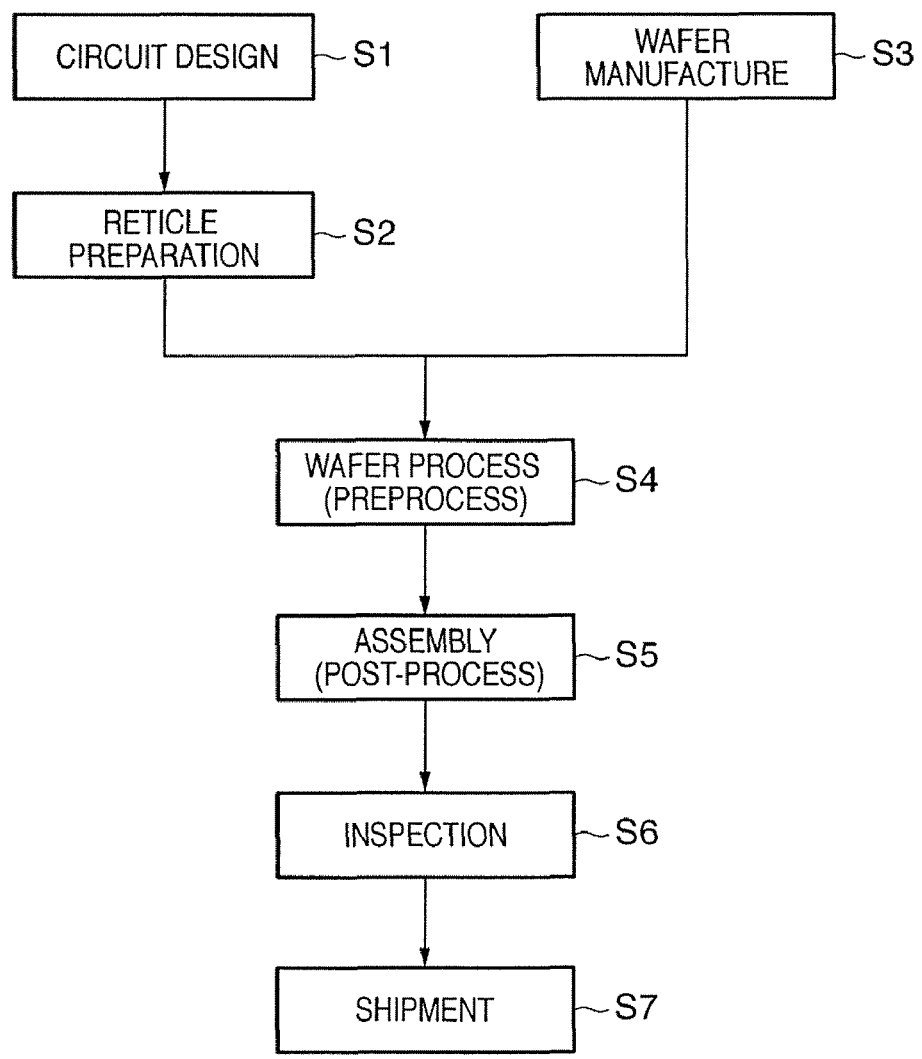
FIG. 8 is a flowchart for explaining device manufacturing.

An embodiment of a device manufacturing method using the above-described exposure apparatus will be described next with reference to FIGS. 8 and 9. FIG. 8 is a flowchart for explaining the manufacture of a device (e.g., a semiconductor chip such as an IC or LSI, LCD, or CCD). A semiconductor chip manufacturing method will be exemplified here. In step S1 (circuit design), the circuit of a device is designed. In step S2 (reticle preparation), a reticle with the designed circuit pattern is prepared. In step S3 (wafer manufacture), a wafer is manufactured using a material such as silicon. In step S4 (wafer process) called a preprocess, an actual circuit is formed on the wafer by lithography using the reticle and wafer. In step S5 (assembly) called a post-process, a semiconductor chip is formed from the wafer prepared in step S4. This step includes processes such as assembly (dicing and bonding) and packaging (chip encapsulation). In step S6 (inspection), inspections including operation check test and durability test of the semiconductor device manufactured in step S5 are performed. A semiconductor device is completed with these processes and shipped (step S7).

Figure 9:
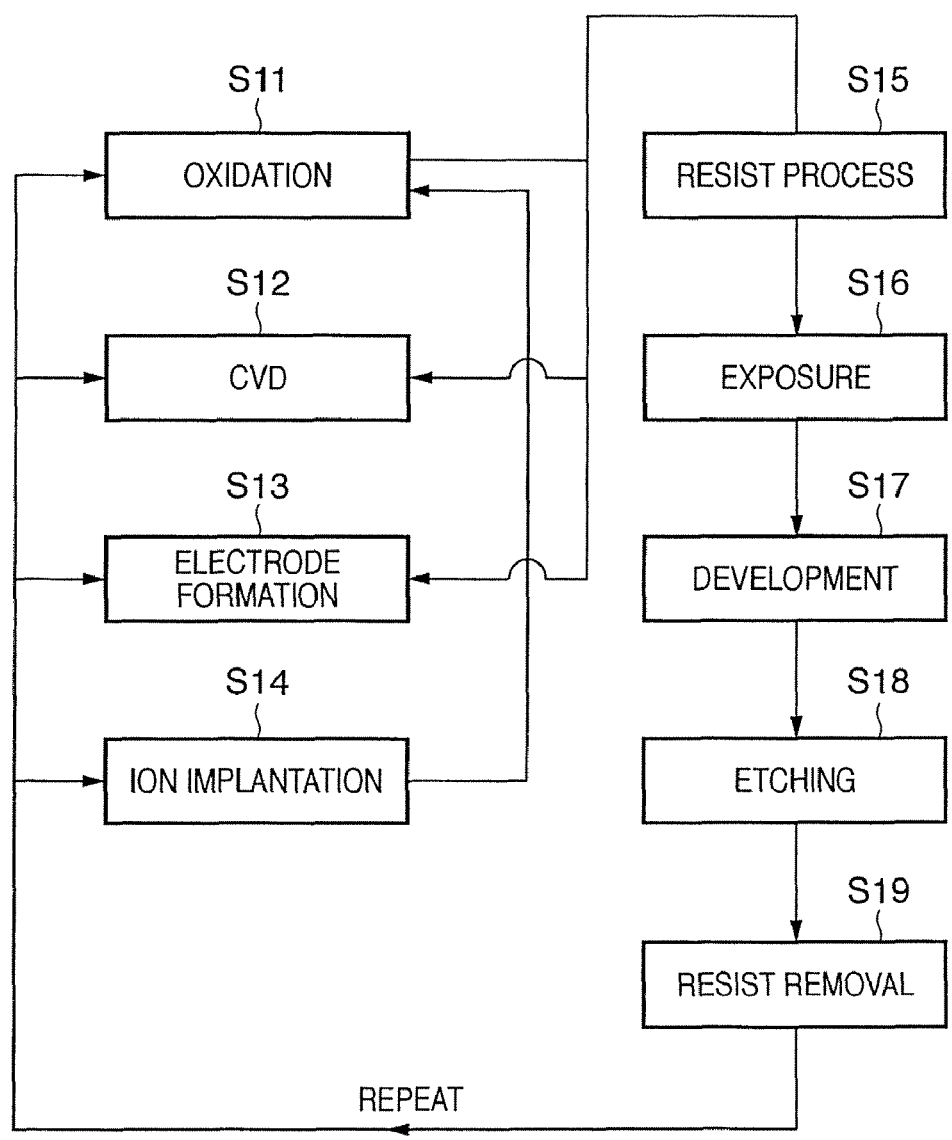
FIG. 9 is a flowchart illustrating details of a wafer process in step S4 in FIG. 8.

FIG. 9 is a flowchart illustrating details of the wafer process in step S4. In step S11 (oxidation), the surface of the wafer is oxidized. In step S12 (CVD), an insulating film is formed on the wafer surface. In step S13 (electrode formation), an electrode is formed on the wafer by deposition. In step S14 (ion implantation), ions are implanted into the wafer. In step S15 (resist process), a photosensitizer is applied to the wafer. In step S16 (exposure), the above-described exposure apparatus exposes the circuit pattern of the reticle to the wafer. In step S17 (development), the exposed wafer is developed. In step S18 (etching), portions other than the developed resist image are etched. In step S19 (resist removal), any unnecessary resist remaining after etching is removed. By repeating these steps, multilayered circuit patterns are formed on the wafer. This device manufacturing method allows to manufacture a device (e.g., semiconductor device or liquid crystal display device) with higher quality than before.

Preferred embodiments of the present invention have been described above. However, the present invention is not limited to these embodiments, and various changes and modifications can be made within the spirit and scope of the invention.

According to the present invention, it is possible to reduce the error of laser beam wavelength compensation, which is generated by the difference between the phase of aerial vibration generated by an air conditioner in the laser optical path of a laser beam for position measurement and that at the wavelength detection position of a wavelength detection unit. This enables more accurate execute wavelength compensation by a wavelength compensation unit and more accurate position measurement.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-331141, filed Dec. 7, 2006, which is hereby incorporated by reference herein in its entirety.

What is claimed is:

1. A position measuring system comprising:
a measurement unit which includes a laser interferometer configured to measure a position of a measurement target by using interference of a laser beam;
a wavelength detection unit configured to detect a wavelength change of the laser beam;
a first compensation unit configured to compensate for the wavelength change detected by said wavelength detection unit on the basis of a phase difference of aerial vibration between said wavelength detection unit and an optical path of said laser interferometer, which is determined on the basis of a difference in length between a first path of the aerial vibration from an aerial vibration source of an air conditioner to said wavelength detection unit and a second path of the aerial vibration from the aerial vibration source to the optical path of said laser interferometer; and a second compensation unit configured to compensate for a measurement value obtained by said laser interferometer on the basis of the wavelength change compensated by said first compensation unit, wherein the first path is shorter than the second path.

2. The system according to claim 1, wherein said first compensation unit delays the wavelength change detected by said wavelength detection unit by an amount corresponding to the phase difference of the aerial vibration and outputs the wavelength change.

3. The system according to claim 1, wherein the first path is a path from a fan to blow a gas to the optical path to said wavelength detection unit, and the second path is a path from the fan to the optical path.

4. The system according to claim 1, wherein each of the first path and the second path has a silencer.

5. The system according to claim 1, wherein said first compensation unit further comprises an acquisition unit configured to acquire the length of the second path on the basis of the position of the measurement target measured by said measurement unit.

6. A position measuring method comprising the steps of:

measuring a position of a measurement target by using a laser interferometer;

causing a wavelength detection unit to detect a wavelength change of a laser beam;

executing first compensation to compensate for the wavelength change detected in the detecting step on the basis of a phase difference of aerial vibration generated by an air conditioner, which is determined on the basis of a difference in a length between a first path of the aerial vibration to said wavelength detection unit and a second path of the aerial vibration to an optical path of the laser interferometer; and executing second compensation to compensate for a measurement value obtained by the laser interferometer on the basis of the wavelength change compensated in said first compensation step, wherein the first path is designed to be shorter than the second path.

7. An exposure apparatus which measures one of a position of a stage with a substrate and a position of a stage with an original plate by using a position measuring system of claim 1.

* * * * *